(12) United States Patent
Sun et al.

(10) Patent No.: US 9,278,512 B2
(45) Date of Patent: Mar. 8, 2016

(54) METHOD OF BONDING AND DEBONDING SUBSTRATE

(71) Applicant: AU Optronics Corporation, Hsin-Chu (TW)

(72) Inventors: Shuo-Yang Sun, Hsin-Chu (TW); Wan-Chen Huang, Hsin-Chu (TW); Wei-Ting Lin, Hsin-Chu (TW); Chun-Cheng Cheng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 292 days.

(21) Appl. No.: 14/167,350

(22) Filed: Jan. 29, 2014

(65) Prior Publication Data

US 2015/0083312 A1 Mar. 26, 2015

(30) Foreign Application Priority Data

Sep. 25, 2013 (TW) .............................. 102134577 A (51) Int. Cl.
| | |
|---|---|
| B29C 65/52 | (2006.01) |
| B32B 37/12 | (2006.01) |
| B32B 37/26 | (2006.01) |
| B32B 38/04 | (2006.01) |
| B32B 38/10 | (2006.01) |
| B32B 43/00 | (2006.01) |
| H01L 21/683 | (2006.01) |
| B32B 38/00 | (2006.01) |

(52) U.S. Cl.
CPC ............. *B32B 38/10* (2013.01); *B32B 37/1284* (2013.01); *H01L 21/6835* (2013.01); *B32B 38/0004* (2013.01); *H01L 2221/6835* (2013.01); *H01L 2221/68318* (2013.01); *H01L 2221/68381* (2013.01)

(58) Field of Classification Search
USPC .......................... 156/247, 248, 701, 718, 719
See application file for complete search history.

(56) References Cited

U.S. PATENT DOCUMENTS

| | | | | |
|---|---|---|---|---|
| 5,937,512 A | * | 8/1999 | Lake ..................... | H01L 21/568 156/233 |
| 6,284,050 B1 | | 9/2001 | Shi et al. | |
| 7,488,539 B2 | * | 2/2009 | Kozakai ................. | C09J 7/0207 428/447 |
| 8,436,481 B2 | * | 5/2013 | Hoshino ............... | H01L 21/568 257/787 |
| 8,557,637 B2 | * | 10/2013 | Chen ..................... | H01L 51/003 438/113 |
| 2002/0117753 A1 | * | 8/2002 | Lee ................... | H01L 23/49805 257/758 |
| 2007/0090299 A1 | * | 4/2007 | Kozakai ................. | C09J 7/0207 250/370.01 |
| 2008/0099134 A1 | * | 5/2008 | Tadakuma .......... | B32B 37/0076 156/250 |
| 2010/0167031 A1 | * | 7/2010 | Leu ......................... | B32B 27/32 428/212 |
| 2010/0243150 A1 | * | 9/2010 | Morimoto ................. | C08J 3/28 156/275.3 |

(Continued)

*Primary Examiner* — Sing P Chan
(74) *Attorney, Agent, or Firm* — WPAT, PC; Justin King (57) ABSTRACT

A substrate bonding and debonding method includes the steps of: providing a substrate; forming a first silicone glue layer on a peel-off region of the substrate and a second silicone glue layer on a peripheral region of the substrate, in which the first and second silicone glue layers contain the same silicone main agent and silicone curing agent in a different ratio; adhering an opposite substrate to the first and second silicone glue layers; curing the first and second silicone glue layers to bond the substrate to the opposite substrate; and separating a portion of the substrate from the opposite substrate.

13 Claims, 6 Drawing Sheets

(56) References Cited

U.S. PATENT DOCUMENTS

| | | | |
|---|---|---|---|
| 2010/0279491 A1* | 11/2010 | Kiuchi | B32B 7/06 438/464 |
| 2011/0030881 A1* | 2/2011 | Sasaki | C09J 7/0217 156/153 |
| 2011/0030882 A1* | 2/2011 | Mizuno | C09J 7/0296 156/153 |
| 2011/0151625 A1* | 6/2011 | Hoshino | H01L 21/568 438/118 |
| 2011/0220268 A1* | 9/2011 | Nishio | B32B 7/12 156/85 |
| 2012/0087002 A1 | 4/2012 | Hsieh et al. | |
| 2012/0164408 A1* | 6/2012 | Hwu | B32B 7/06 428/202 |
| 2014/0094079 A1* | 4/2014 | Ito | H01L 27/32 445/24 |
| 2015/0044792 A1* | 2/2015 | Aoyama | H01L 51/003 438/27 |
| 2015/0231858 A1* | 8/2015 | van Neer | B32B 7/12 428/201 |
| 2015/0236280 A1* | 8/2015 | Sakuishi | H01L 51/0097 257/99 |
| 2015/0334488 A1* | 11/2015 | Kim | H04W 76/002 381/2 |

* cited by examiner

METHOD OF BONDING AND DEBONDING SUBSTRATE

RELATED APPLICATIONS

This application claims priority to Taiwan application Serial Number 102134577, filed Sep. 25, 2013, the entirety of which is incorporated herein by reference.

BACKGROUND

1. Technical Field

The present disclosure relates to a method of a substrate bonding and debonding, and in particular relates to a method of bonding and debonding a flexible substrate to another substrate.

2. Description of Related Art

With rapid progress in display technologies, liquid crystal display (LCD) devices, mobile phones, laptops, as well as digital cameras have become important electronic products in market. These electronic products all come with a display panel that performs as a medium to display images. In recent years, many researchers have been devoted to developing flexible display panels in order to broaden the application of the display device. Nevertheless, there are many difficulties in the process when manufacturing flexible display panels. For example, in the manufacturing process of the flexible display panel, usually the flexible substrate is first firmly placed on a carrier and later various components of the display panel are formed on the flexible substrate. After the formation of the components, the flexible substrate is separated from the carrier and a flexible display panel is available. Therefore, in the manufacturing process of the flexible display panel, the flexible substrate has not only to be firmly placed on the carrier, but also to endure the harshness in the manufacturing environment and afterwards capable of being parted from the carrier. As far as present techniques are concerned, the conventional manufacturing approaches still face many difficulties. Thus, a novel method is highly in need to bond and debond two substrates as well as to endure the severe manufacturing environment.

SUMMARY

A substrate bonding and debonding method is provided. The method includes the steps of: providing a substrate having a peel-off region and a peripheral region surrounding the peel-off region; forming a first silicone glue layer on the peel-off region of the substrate and forming a second silicone glue layer on the peripheral region of the substrate, wherein each of the first silicone glue layer and the second silicone glue layer includes an identical silicone main agent and an identical silicone curing agent, the volume ratio of the silicone main agent to the silicone curing agent of the first silicone glue layer is about 12:1 to about 15:1, and the volume ratio of the silicone main agent to the silicone curing agent of the second silicone glue layer is about 1:1 to about 5:1; adhering an opposite substrate to the first silicone glue layer and the second silicone glue layer; curing the first silicone glue layer and the second silicone glue layer to bond the substrate to the opposite substrate; and separating a portion of the substrate from the opposite substrate.

According to one embodiment of the present disclosure, one of the substrate and the opposite substrate is a flexible substrate, and the other one of the substrate and the opposite substrate is a rigid substrate.

According to one embodiment of the present disclosure, the step of separating the portion of the substrate from the opposite substrate include separating a portion of the substrate in the peel-off region from the opposite substrate.

According to one embodiment of the present disclosure, the substrate is a flexible substrate, and the opposite substrate is a rigid substrate.

According to one embodiment of the present disclosure, the method further includes forming a cutting line in the flexible substrate prior to the step of separating the portion of the substrate from the opposite substrate, wherein the cutting line is positioned in the peel-off region or between the peel-off region and the peripheral region.

According to one embodiment of the present disclosure, the method further includes forming a semiconductor device on the flexible substrate after the step of curing the first silicone glue layer and the second silicone glue layer.

According to one embodiment of the present disclosure, the method further includes forming a color filter layer on the flexible substrate after the step of curing the first silicone glue layer and the second silicone glue layer.

According to one embodiment of the present disclosure, the step of adhering the opposite substrate to the first silicone glue layer and the second silicone glue layer includes pressing a flexible substrate onto a rigid substrate by using a roller.

According to one embodiment of the present disclosure, the substrate is flexible, and the peripheral region has a first peripheral region and a second peripheral region respectively on opposite sides of the substrate, in which an amount of the second silicone glue layer formed on the second peripheral region is greater than an amount of the second silicone glue layer formed on the first peripheral region.

According to one embodiment of the present disclosure, the step of adhering the opposite substrate to the first silicone glue layer and the second silicone glue layer includes pressing the substrate having the first silicone glue layer and the second silicone glue layer onto the opposite substrate by a roller, starting from a side of the first peripheral region.

According to one embodiment of the present disclosure, the step of adhering the opposite substrate to the first silicone glue layer and the second silicone glue layer includes forming a compositional transition region, which has a continuous change in composition, between the first glue layer and the second silicone glue layer.

According to one embodiment of the present disclosure, the step of forming the first silicone glue layer on the peel-off region and the second silicone glue layer on the peripheral region includes sprinkling the first silicone glue layer onto the peel-off region by a nozzle and sprinkling the second silicone glue layer onto the peripheral region by another nozzle.

According to one embodiment of the present disclosure, in the step of forming the first silicone glue layer on the peel-off region and the second silicone glue layer on the peripheral region, the first silicone glue layer only covers a portion of the peel-off region, and the second silicone glue layer only covers a portion of the peripheral region.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
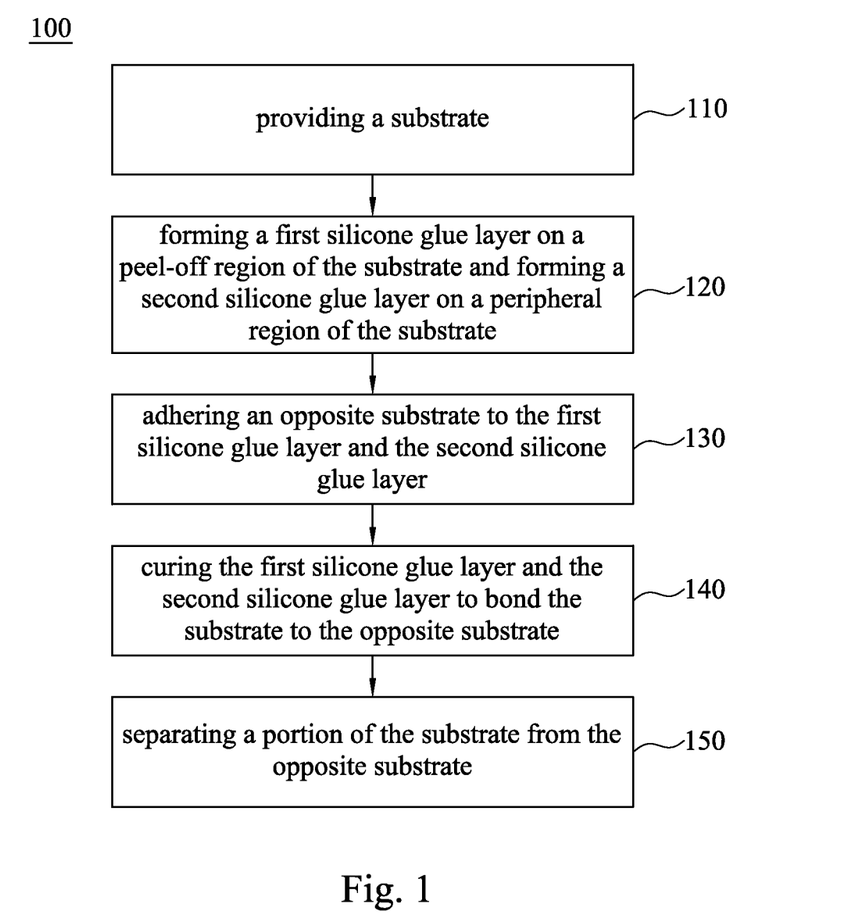
FIG. 1 is a flow chart illustrating a substrate bonding and debonding method according to various embodiments of the present disclosure.

Disclosed hereinafter is a substrate bonding and debonding method. Specifically, in this method, a substrate is first bonded to another substrate and later debonded from each other. FIG. 1 is a flow chart illustrating a substrate bonding and debonding method 100 according to various embodiments of the present disclosure. The method 100 includes at least Steps 110, 120, 130, 140 and 150. FIGS. 2-7 are drawings schematically illustrating various stages in the manufacturing process of the method 100.

Figure 2:
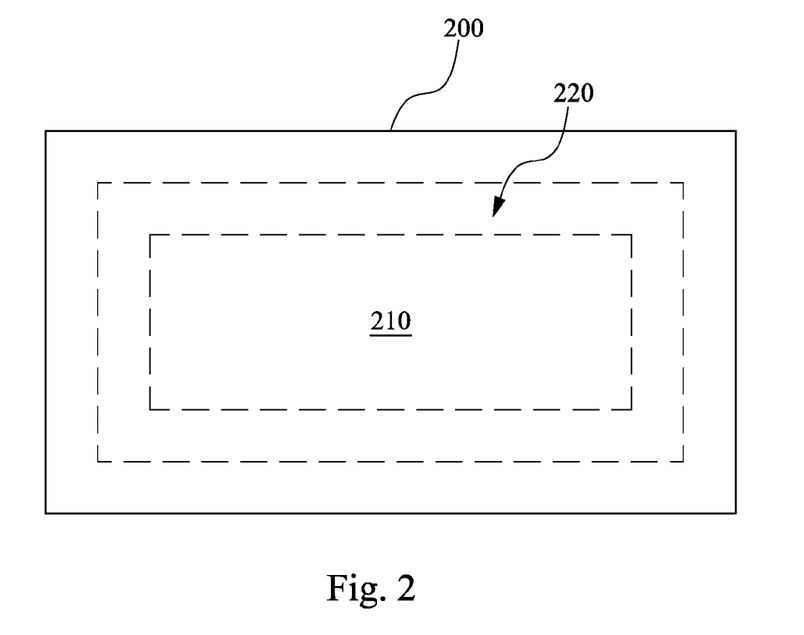
FIG. 2 is a top view schematically illustrating a process step of the substrate bonding and debonding method according to one embodiment of the present disclosure.

In Step 110, a substrate 200 is provided, as shown in FIG. 2. The substrate 200 has at least a peel-off region 210 and at least a peripheral region 220. In the embodiment depicted in FIG. 2, the peel-off region 210 is substantially positioned in the middle region of the substrate 200 and surrounded by the peripheral region 220. The substrate 200 may be a flexible or rigid substrate. In one embodiment where the substrate 200 is flexible, the substrate 200 may be, for example, made of polyimide, polyethylene terephtalate (PET), polyethylene 2,6-naphthalate (PEN) or other suitable polymeric material. Otherwise, the substrate 200 may be a flexible glass substrate thinner than 100 μm in thickness. In one embodiment where the substrate 200 is rigid, the substrate 200 may be, for example, a soda lime glass, sodium-free glass or low-sodium glass.

Figure 3:
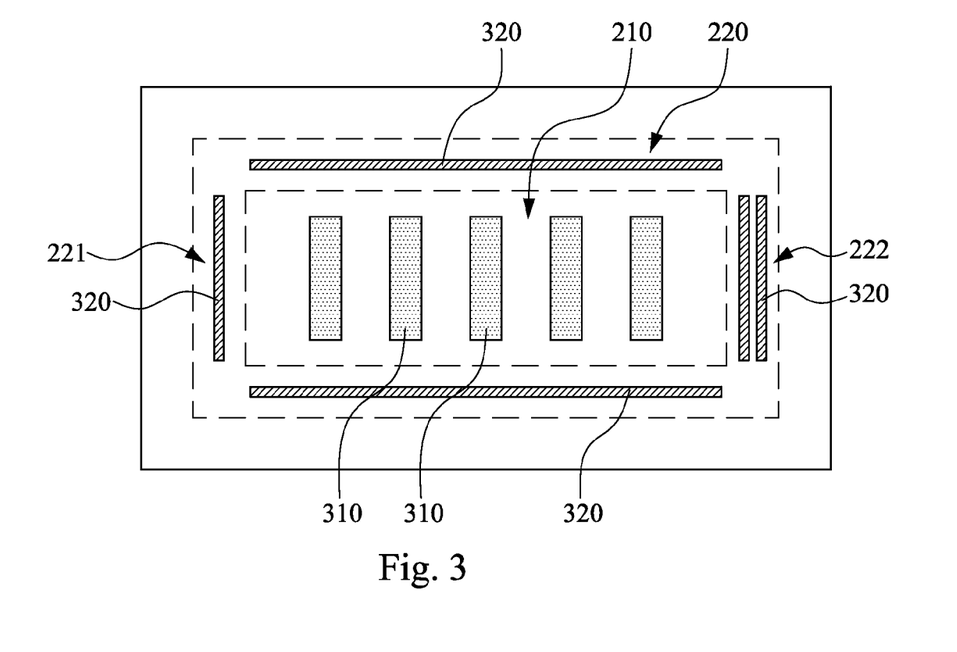
FIG. 3 is a top view schematically illustrating a process step of the substrate bonding and debonding method according to one embodiment of the present disclosure.

In Step 120, a first silicone glue layer 310 is formed on the peel-off region 210 of the substrate 200, and a second silicone glue layer 320 is formed on the peripheral region 220 of the substrate 200, as depicted in FIG. 3. The first silicone glue layer 310 and the second silicone glue layer 320 include an identical silicone main agent and an identical silicone curing agent in composition. However, in the first silicone glue layer 310 and the second silicone glue layer 320, the ratio of the silicone main agent to the silicone curing agent is different. To specify, the volume ratio of the silicone main agent to the silicone curing agent of the first silicone glue layer 310 is about 12:1 to about 15:1, and the volume ratio of the silicone main agent to the silicone curing agent of the second silicone glue layer 320 is about 1:1 to about 5:1. It is noted that the first silicone glue layer 310 and the second silicone glue layer 320 includes identical ingredients but a different ratio of the silicone main agent to the silicone curing agent, and thus provides a particular technical effect according to various embodiments of the present disclosure. More detailed description will be given hereinafter.

In one embodiment, in the step of forming the first silicone glue layer 310 and the second silicone glue layer 320, the first silicone glue layer 310 only covers a portion of the peel-off region 210, and the second silicone glue layer covers only a portion of the peripheral region 220. In other words, the first silicone glue layer 310 doesn't cover the entire peel-off region 210, and the second silicone glue layer 320 doesn't cover the entire peripheral region 220, either. For example, a sprayer or nozzle may be utilized to sprinkle the first silicone glue layer 310 onto the peel-off region 210, and another sprayer or nozzle may be utilized to sprinkle the second silicone glue layer 320 onto the peripheral region 220. Moreover, the order in forming the first silicone glue layer 310 and the second silicone glue layer 320 is not restricted. For instance, the first silicone glue layer 310 may be formed before the second silicone glue layer 320 is formed. Otherwise, the second silicone glue layer 320 may be formed prior to forming the first silicone glue layer 310. Else, the first silicone glue layer 310 and the second silicone glue layer 320 may be formed simultaneously. In the embodiment depicted in FIG. 3, the first silicone glue layer 310 and/or the second silicone glue layer 320 are formed in a strip pattern. In other embodiments, the first silicone glue layer 310 and/or the second silicone glue layer 320 may be formed in other patterns, such as dots or meshes (not shown).

In another embodiment, the peripheral region 220 of the substrate 200 includes a first peripheral region 221 and a second peripheral region 222. The first peripheral region 221 and the second peripheral region 222 are positioned on the opposite sides of the substrate 200. In this embodiment, the amount of the second silicone glue layer 320 on the second peripheral region 222 is greater than the amount of the second silicone glue layer 320 on the first peripheral region 221. That is, the weight (or volume) of the second silicone glue layer 320 on the second peripheral region 222 is greater than the weight (or volume) of the second glue layer 320 on the first peripheral region 221. In specifics, the weight (or volume) of the second silicone glue layer 320 on the second peripheral region 222 is about 2 to about 4 times, specifically about 2 to about 3 times, the weight (or volume) of the second glue layer 320 on the first peripheral region 221. For example, a strip of the second silicone glue may be formed on the first peripheral region 221, while on the second peripheral region 222, two or three strips of the second silicone glue may be formed.

Figure 4:
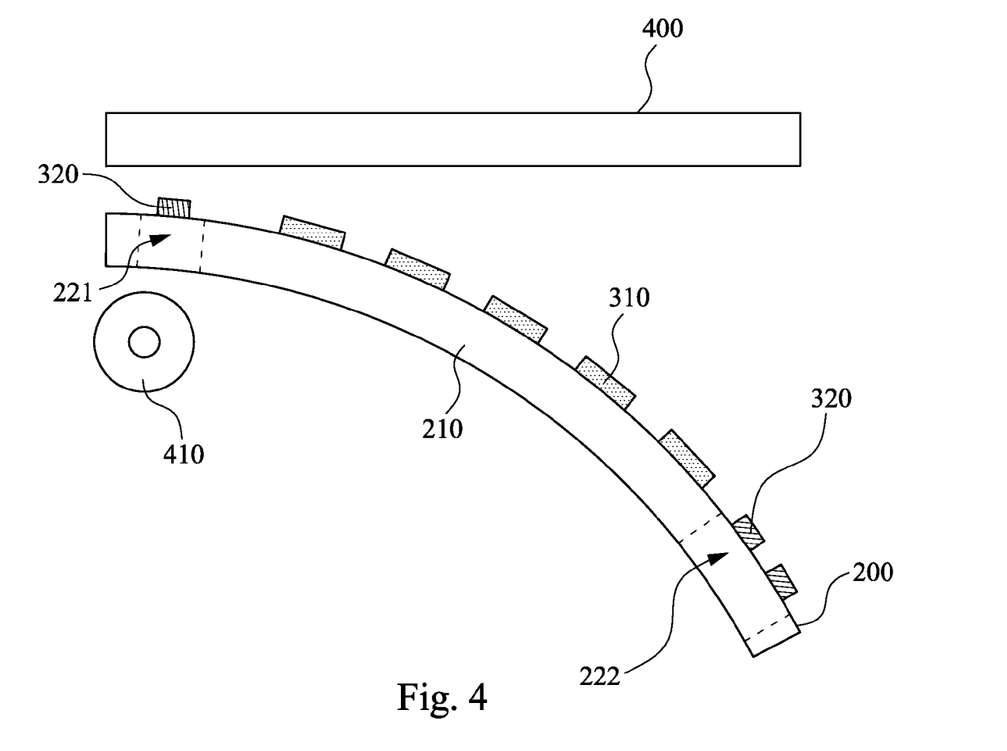
FIG. 4 is a side view schematically illustrating a process step of the substrate bonding and debonding method according to one embodiment of the present disclosure.

In Step 130, an opposite substrate 400 is adhered to the first silicone glue layer 310 and the second silicone glue layer 320, as depicted in FIG. 4. In one embodiment, one of the substrate 200 and the opposite substrate 400 is a flexible substrate, and the other one is a rigid substrate. For instance, if the substrate 200 is a flexible substrate, the opposite substrate 400 is a rigid substrate. Otherwise, when the substrate 200 is rigid, the opposite substrate 400 is flexible. In other words, in Step 120, the first silicone glue layer 310 and the second silicone glue layer 320 may be formed on a rigid substrate or a flexible substrate.

FIG. 4 shows an exemplary embodiment in which the substrate 200 is a flexible substrate. In this embodiment, a roller 410 is utilized to press or laminate the flexible substrate 200 onto the rigid opposite substrate 400. In one example, the roller 410 turns from the side of the first peripheral region 221 on the substrate 200 gradually to the side of the second peripheral region 222. Thereby, the substrate 200 is pressed or laminated onto the opposite substrate 400, so that both the first silicone glue layer 310 and the second silicone glue layer 320 are interposed between the substrate 200 and the opposite substrate 400. In this embodiment, a continuously compositional transition region 230 (shown in FIG. 5) is formed between the first silicone glue layer 310 and the second silicone glue layer 320. In specifics, when the roller 410 turns and presses the substrate 200 from the first peripheral region 221, because of the pressure from the roller 410, the second silicone glue layer 320 on the first periphery 221 flows to the peel-off region 210 and mixes up with the first silicone glue layer 310 originally disposed on the peel-off region 210, and therefore a compositional transition region 230 is formed. Particularly, the silicone glue layer of the compositional transition region 230 is formed by mixing the first silicone glue layer 310 and the second silicone glue layer 320, and therefore the composition of the compositional transition region 230 is restrained between the first silicone glue layer 310 and the second silicone glue layer 320. In addition, according to the process characteristics and mass transport phenomena, the ratio of the silicone main agent to the silicone curing agent of the compositional transition region 230 is gradually changed. That is to say, the concentrations of the silicone main agent and the silicone curing agent varies continuously in the compositional transition region 230, and there does not exist a non-continuous change in composition and/or concentration between the first silicone glue layer 310 and the second silicone glue layer 320. As a result, a continuously compositional transition region 230 may be formed.

In still another embodiment, in view of the movement of the roller 410, the amount of the second silicone glue layer 320 at the press-starting side is different from that at the press-finishing side. Specifically, in Step 120, more second silicone glue is spread on the second peripheral region 222 where the roller 410 finishes the press. Therefore, the amount of the second silicone glue layer 320 on the second peripheral region 222 is larger than that on the first periphery 221. The reason why more quantity (volume) of the second silicone glue is formed on the second periphery region 222 is that more quantity of the first silicone glue layer 310 is pushed into the second peripheral region 222 by the roller 410 when it reaches the second peripheral region 222; consequently, the second silicone glue layer 320 on the second peripheral region 222 is heavily diluted. Therefore, more quantity of the second silicone glue layer 320 is formed on the second peripheral region 222 so as to maintain the ratio of the silicone main agent to the silicone curing agent in the second peripheral region 222.

Figure 5:
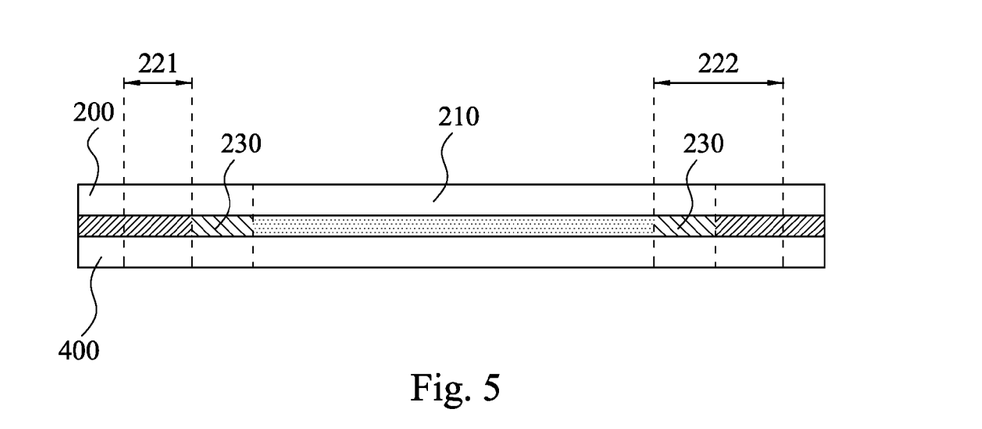
FIG. 5 is a cross-sectional view schematically illustrating a process step of the substrate bonding and debonding method according to one embodiment of the present disclosure.

In step 140, the first silicone glue layer 310 and the second silicone glue layer 320 are cured in order to bond the substrate 200 with the opposite substrate 400, as depicted in FIG. 5. FIG. 5 is depicted in a way that the structure in FIG. 4 is turned over, and thus the substrate 200 is positioned over the opposite substrate 400 in FIG. 5. In one embodiment, the first silicone glue layer 310 and the second silicone glue layer 320 may be cured through a thermal process. The temperature of the thermal chamber may be set at about 200° C. to about 250° C., for example.

Figure 8:
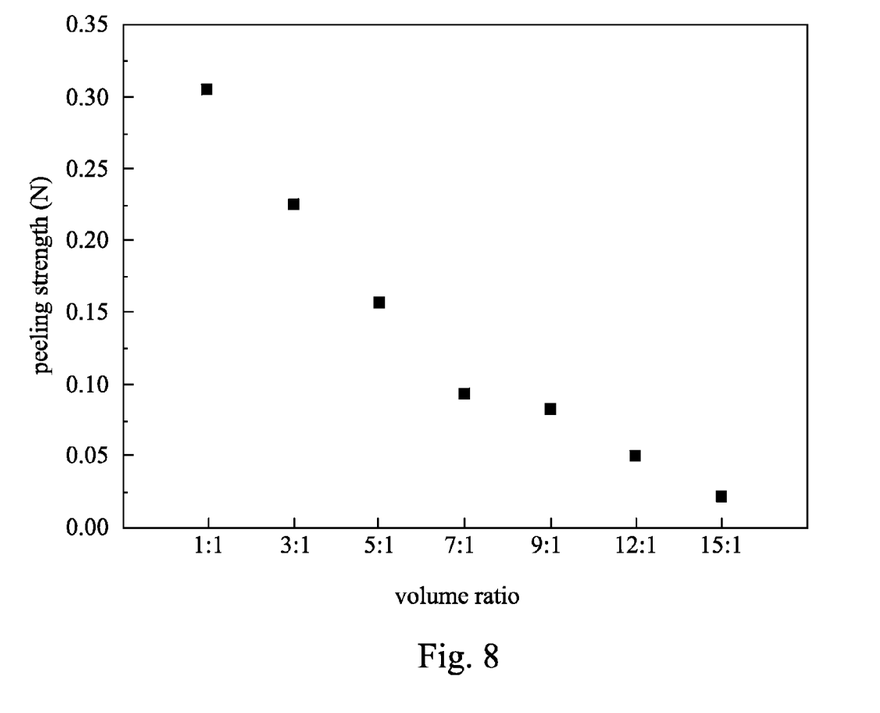
FIG. 8 is a graph showing the relationship between the peeling strength and the volume ratio of the silicone main agent to the silicone curing agent according to one embodiment of the present disclosure.

The cured first silicone glue layer 310 and cured second silicone glue layer 320 have different peeling strength (i.e., adhesion). As described in Step 120 hereinbefore, the volume ratio of the silicone main agent to the silicone curing agent of the first silicone glue layer 310 is about 12:1 to about 15:1, and the volume ratio of the silicone main agent to the silicone curing agent of the second silicone glue layer 320 is about 1:1 to about 5:1. FIG. 8 is a graph showing the relationship between the peeling strength (i.e., adhesion) and the volume ratio of the silicone main agent to the silicone curing agent according to one embodiment of the present disclosure. As depicted in FIG. 8, when the volume ratio of the silicone main agent to the silicone curing agent is about 12:1 to about 15:1 (i.e., the first silicone glue layer), the peeling strength is about 0.02 Newton (N) to about 0.05 Newton (N). When the volume ratio of the silicone main agent to the silicone curing agent is about 1:1 to about 5:1 (i.e., the second silicone glue layer), peeling strength is about 0.15 N to about 0.31 N. Therefore, the first silicone glue layer 310 on the peel-off region 210 exhibits weak peeling strength, while the second silicone glue layer 320 on the peripheral region 220 possesses strong peeling strength. Besides, the composition of the silicone glue layer in the compositional transition region 230 is between the first silicone glue layer 310 and the second silicone glue layer 320, so that the peeling strength of the silicone glue in the compositional transition region 230 is between the first silicone glue layer 310 and the second silicone glue layer 320, in which the peeling strength gradually decreases from the side adjacent to the peripheral region 220 to the side adjacent to the peel-off region 210.

The first silicone glue layer 310 and the second silicone glue layer 320 include an identical silicone main agent and an identical silicone curing agent, in which a continuous change in composition is formed between the first silicone glue layer 310 and the second silicone glue layer 320, such that the cured first and second glue layer 310, 320 provide excellent stability. Significantly, according to one comparative example of the present disclosure, an ultraviolet-curing glue layer and a thermal-curing glue layer are formed respectively on the peel-off region 210 and on the peripheral region 220 of the substrate 200. In this comparative example, although both the cured glue layers may bond the substrate 200 and the opposite substrate 400 together, cracks undesirably occur at the interface between the two glue layers in the subsequent process. After analyzing the causes, the inventor of the present disclosure has discovered that the cracks is formed due to a discontinuous change in composition at the interface between the two glue layers because the basic compositions of the two glue layers are essentially different. In a high temperature environment, thermal stress leads to the formation of the cracks at the interface where the composition is discontinuously changed. Therefore, one of the features of the present disclosure is that the first silicone glue layer 310 and the second silicone glue layer 320 include the identical silicone main agent and the identical silicone curing agent. In addition, according to the results from numerous experiments and detailed analysis, a multiple-agent glue (i.e., including at least a main agent and a curing agent) that includes silicone provides an excellent continuity in composition at the interface. In other comparative examples of the present disclosure, in which glue made from either epoxy resin or acrylic resin are used, the thermal stability thereof turns out to be inferior and a continuous interface is not easily formed.

Figure 6A:
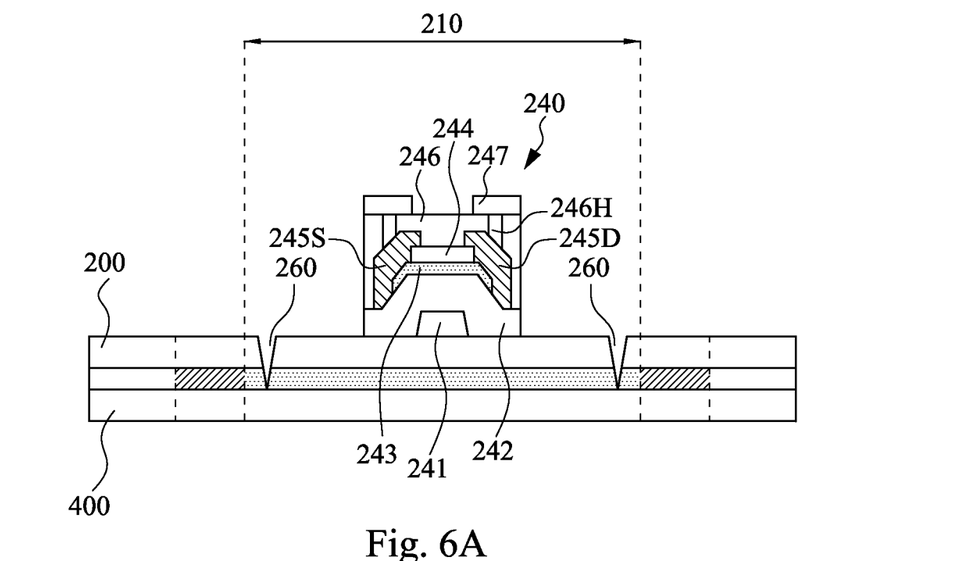
FIGS. 6A and 6B are cross-sectional views schematically illustrating a process step of the substrate bonding and debonding method according to one embodiment of the present disclosure.

After Step 140, other components may be optionally formed on the substrate 200. In one embodiment, after the first silicone glue layer 310 and the second silicone glue layer 320 are cured, a semiconductor device 240 is optionally formed on the peel-off region 210 of the flexible substrate 200, as depicted in FIG. 6A. The semiconductor device 240 may be any type or any structure of the semiconductor devices such as transistors, diodes, photosensors, solar cells or other photo-electronic components. In the embodiment of FIG. 6A, the semiconductor device 240 includes a gate electrode 241, an insulation layer 242, a semiconductor layer 243, an etch stop layer 244, a source electrode 245S, a drain electrode 245D, a protective layer 246 and a pixel electrode 247. The gate electrode 241 disposed on the substrate 200 may be formed through the processes such as sputtering, pulse laser vapor deposition, electron beam evaporation, or chemical vapor deposition. The gate electrode 241 may be a single-layered structure or a multiple-layer structure. The gate electrode 241 may be made of conductive metal material such as platinum, gold, nickel, aluminum, zirconium, copper, neodymium, an alloy or a combination thereof. Moreover, photolithography techniques may be utilized to form the patterned gate electrode 241. The insulation layer 242 covers the gate electrode 241 to prevent the gate electrode 241 from a direct contact with the source electrode 245S, the drain electrode 245D and the semiconductor layer 243. The insulation layer 242 may be formed through the processes such as sputtering, pulse laser vapor deposition, electron beam evaporation, or chemical vapor deposition. The insulation layer 242 may include an inorganic material such as silicon dioxide ($SiO_x$) and silicon nitride ($SiN_y$) or includes a polymeric organic material with dielectric properties. The semiconductor layer 243 may include indium gallium zinc oxide (IGZO), indium zinc oxide (IZO), indium gallium oxide (IGO), tin oxide (ZnO), cadmium oxide-germanium oxide ($2CdO.GeO_2$), nickel cobalt oxide ($NiCo_2O_4$) or a combination thereof. In other embodiments, the semiconductor layer 243 may be made of amorphous silicon or polycrystalline silicon. The etch stop layer 244 covers a portion of the semiconductor layer 243, but the other portion of the semiconductor layer 243 is exposed, not covered by the etch stop layer 244. More specifically, two different sides of the semiconductor layer 243 are exposed out of the etch stop layer 244. The etch stop layer 244 may be, for example, made of silicon dioxide. It is noted that the present disclosure is not limited to the material described hereinbefore. The source electrode 245S and the drain electrode 245D are formed respectively on the different sides of the semiconductor layer 243, and the source electrode 245S and the drain electrode 245D cover a portion of the etch stop layer 244. When forming the source electrode 245S and the drain electrode 245D, etching processes are usually utilized, and therefore the etch stop layer 244 is configured to protect the semiconductor layer 243 in the etching processes. After the source electrode 245S and the drain electrode 245D are formed, the protective layer 246 is formed to cover the source electrode 245S, the drain electrode 245D, the semiconductor layer 242 and the etch stop layer 244. The protective layer 246 protects the structures there under and prevents moisture and oxygen from penetrating to the structures. The protective layer 246 may have at least an opening 246H exposing a portion of the source electrode 245S and/or the drain electrode 245D. The pixel electrode 247 is formed on the protective layer 246, and the pixel electrode 247 connects with the drain electrode 245D via the opening 246H. One skilled in the art would appreciate that the semiconductor device described in this disclosure is not limited to the structure depicted in FIG. 6A. According to one embodiment of the present disclosure, when the substrate 200 is a flexible substrate, an active array structure may be formed on the flexible substrate, and that becomes a flexible active array substrate. The flexible active array substrate may be applied in flexible LCD panels, flexible organic light-emitting diode panels, flexible electroluminescent devices or other flexible devices.

Figure 6B:
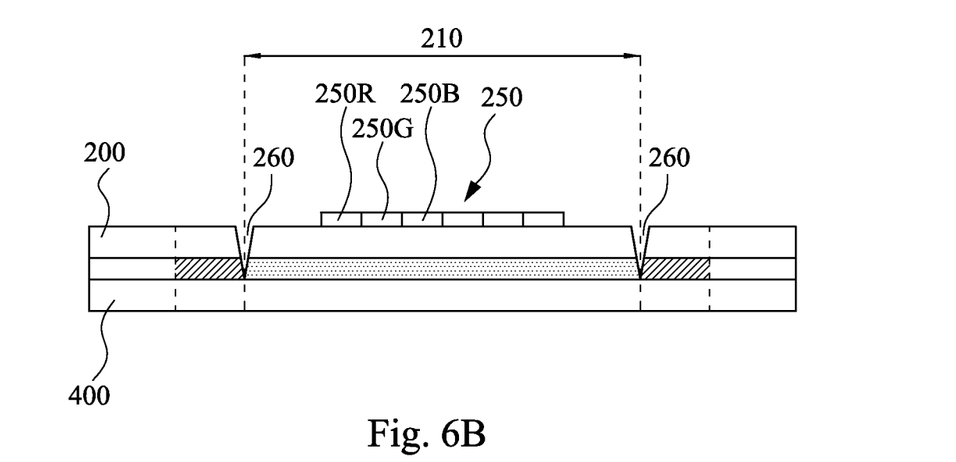

In still another embodiment, after the first silicone glue layer 310 and the second silicone glue layer 320 are cured, a color filter layer 250 may be optionally formed on the peel-off region 210 of the substrate 200, as depicted in FIG. 6B. The color filter layer 250 may include a red color resistant layer 250R, a green color resistant layer 250G and a blue color resistant layer 250B. According to one embodiment of the present disclosure, when the substrate 200 is flexible, the color filter layer 250 may be formed on the flexible substrate 200, and thereby forming a flexible color filter. According to one embodiment of the present disclosure, a flexible active array substrate and a flexible color filter may be manufactured. The flexible active array substrate and the flexible color filter may be used to manufacture the flexible LCD panel.

Figure 7:
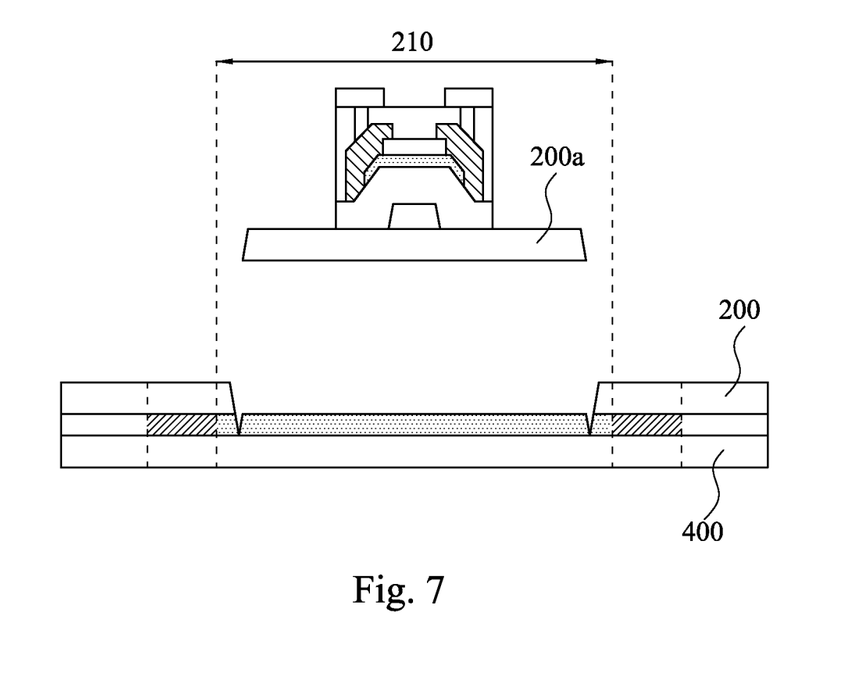
FIG. 7 is a cross-sectional view schematically illustrating a process step of the substrate bonding and debonding method according to one embodiment of the present disclosure.

In Step 150, a portion of the substrate 200 is debonded from the opposite substrate 400 as depicted in FIG. 7. In specifics, Step 150 includes separating a portion 200a of the substrate 200 on the peel-off region 210 from the opposite substrate 400. In one embodiment, after Step 140 but prior to carrying out Step 150, the substrate 200 is cut to form a cutting line 260. The cutting line 260 may be in the peel-off region 210, or between the peel-off region 210 and the peripheral region 220, as depicted in FIG. 6A and in FIG. 6B.

According to various embodiments disclosed herein, when the flexible substrate is bonded to the rigid substrate, the silicone glue layer exhibits excellent stability and may endure the high temperature environment and severe conditions in the subsequent processes. Therefore, the embodiment disclosed herein may be applied in the manufacture of the flexible display panel and other flexible electronic devices.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims.

What is claimed is:

1. A substrate bonding and debonding method, comprising:
   providing a substrate having a peel-off region and a peripheral region surrounding the peel-off region;
   forming a first silicone glue layer on the peel-off region of the substrate and forming a second silicone glue layer on the peripheral region of the substrate, wherein each of the first silicone glue layer and the second silicone glue layer includes an identical silicone main agent and an identical silicone curing agent, the volume ratio of the silicone main agent to the silicone curing agent of the first silicone glue layer is about 12:1 to about 15:1, and the volume ratio of the silicone main agent to the silicone curing agent of the second silicone glue layer is about 1:1 to about 5:1;
   adhering an opposite substrate to the first silicone glue layer and the second silicone glue layer;
   curing the first silicone glue layer and the second silicone glue layer to bond the substrate to the opposite substrate; and
   separating a portion of the substrate from the opposite substrate.

2. The method according to claim 1, wherein one of the substrate and the opposite substrate is a flexible substrate, and the other one of the substrate and the opposite substrate is a rigid substrate.

3. The method according to claim 1, wherein the step of separating the portion of the substrate from the opposite substrate include separating a portion of the substrate in the peel-off region from the opposite substrate.

4. The method according to claim 1, wherein the substrate is a flexible substrate, and the opposite substrate is a rigid substrate.

5. The method according to claim 4, further comprising forming a cutting line in the flexible substrate prior to the step of separating the portion of the substrate from the opposite substrate, wherein the cutting line is positioned in the peel-off region or between the peel-off region and the peripheral region.

6. The method according to claim 4, further comprising forming a semiconductor device on the flexible substrate after the step of curing the first silicone glue layer and the second silicone glue layer.

7. The method according to claim 4, further comprising forming a color filter layer on the flexible substrate after the step of curing the first silicone glue layer and the second silicone glue layer.

8. The method according to claim 4, wherein the step of adhering the opposite substrate to the first silicone glue layer and the second silicone glue layer comprises pressing the flexible substrate onto the rigid substrate by using a roller.

9. The method according to claim 1, wherein the substrate is flexible, and the peripheral region has a first peripheral region and a second peripheral region respectively on opposite sides of the substrate, wherein an amount of the second silicone glue layer formed on the second peripheral region is greater than an amount of the second silicone glue layer formed on the first peripheral region.

10. The method according to claim 9, wherein the step of adhering the opposite substrate to the first silicone glue layer and the second silicone glue layer comprises pressing the substrate having the first silicone glue layer and the second silicone glue layer onto the opposite substrate by a roller, starting from a side of the first peripheral region.

11. The method according to claim 1, wherein the step of adhering the opposite substrate to the first silicone glue layer and the second silicone glue layer comprises forming a compositional transition region, which has a continuous change in composition, between the first glue layer and the second silicone glue layer.

12. The method according to claim 1, wherein the step of forming the first silicone glue layer on the peel-off region and the second silicone glue layer on the peripheral region comprises sprinkling the first silicone glue layer onto the peel-off region by a nozzle and sprinkling the second silicone glue layer onto the peripheral region by another nozzle.

13. The method according to claim 1, wherein the first silicone glue layer only covers a portion of the peel-off region, and the second silicone glue layer only covers a portion of the peripheral region in the step of forming the first silicone glue layer on the peel-off region and the second silicone glue layer on the peripheral region.

* * * * *